United States Patent
Shih et al.

(10) Patent No.: US 10,950,564 B2
(45) Date of Patent: *Mar. 16, 2021

(54) METHODS OF FORMING MICROELECTRONIC DEVICES HAVING A PATTERNED SURFACE STRUCTURE

(71) Applicant: Micron Technology, Inc., Boise, ID (US)

(72) Inventors: Shing-Yih Shih, New Taipei (TW); Tieh-Chiang Wu, Taoyuan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/414,440

(22) Filed: May 16, 2019

(65) Prior Publication Data

US 2019/0273058 A1 Sep. 5, 2019

Related U.S. Application Data

(60) Continuation of application No. 15/966,447, filed on Apr. 30, 2018, now Pat. No. 10,354,966, which is a (Continued)

(51) Int. Cl.
*H01L 23/00* (2006.01)

(52) U.S. Cl.
CPC ............. *H01L 24/05* (2013.01); *H01L 24/03* (2013.01); *H01L 24/11* (2013.01); *H01L 24/13* (2013.01);
(Continued)

(58) Field of Classification Search
CPC ......... H01L 24/05; H01L 24/13; H01L 24/03; H01L 24/11; H01L 2224/05082;
(Continued)

(56) References Cited

U.S. PATENT DOCUMENTS 7,915,730 B2 3/2011 Chyi
8,853,853 B2 10/2014 Chang et al.
(Continued)

FOREIGN PATENT DOCUMENTS

CN 1917196 A 2/2007
CN 102969344 A 3/2013
(Continued)

OTHER PUBLICATIONS

Taiwanese Office Action from Taiwanese Application No. 104130982, dated Sep. 5, 2017, 12 pages with English translation.
(Continued)

*Primary Examiner* — Thanh Y. Tran
(74) *Attorney, Agent, or Firm* — TraskBritt

(57) ABSTRACT

A connector structure and a manufacturing method thereof are provided. The connector structure includes a semiconductor substrate, a metal layer, a passivation layer, and a conductive structure. The metal layer is over the semiconductor substrate. The passivation layer is over the metal layer and includes an opening. The conductive structure is in contact with the metal layer in a patterned surface structure of the conductive structure through the opening of the passivation layer.

18 Claims, 10 Drawing Sheets

Related U.S. Application Data division of application No. 14/731,426, filed on Jun. 5, 2015, now Pat. No. 10,008,461.

(52) U.S. Cl.
CPC ............... *H01L 2224/02125* (2013.01); *H01L 2224/0362* (2013.01); *H01L 2224/03622* (2013.01); *H01L 2224/0401* (2013.01); *H01L 2224/051* (2013.01); *H01L 2224/05005* (2013.01); *H01L 2224/05012* (2013.01); *H01L 2224/05015* (2013.01); *H01L 2224/05017* (2013.01); *H01L 2224/05082* (2013.01); *H01L 2224/05111* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05184* (2013.01); *H01L 2224/05551* (2013.01); *H01L 2224/05558* (2013.01); *H01L 2224/05578* (2013.01); *H01L 2224/05611* (2013.01); *H01L 2224/05639* (2013.01); *H01L 2224/05644* (2013.01); *H01L 2224/05647* (2013.01); *H01L 2224/05655* (2013.01); *H01L 2224/05686* (2013.01); *H01L 2224/10125* (2013.01); *H01L 2224/1145* (2013.01); *H01L 2224/1146* (2013.01); *H01L 2224/11849* (2013.01); *H01L 2224/13018* (2013.01); *H01L 2224/13111* (2013.01); *H01L 2224/13139* (2013.01); *H01L 2224/13144* (2013.01); *H01L 2224/13147* (2013.01); *H01L 2924/04941* (2013.01); *H01L 2924/05042* (2013.01); *H01L 2924/05341* (2013.01); *H01L 2924/05432* (2013.01); *H01L 2924/05442* (2013.01); *H01L 2924/06* (2013.01); *H01L 2924/07025* (2013.01); *H01L 2924/3511* (2013.01)

(58) Field of Classification Search
CPC ... H01L 2224/0401; H01L 2224/05017; H01L 2224/05012; H01L 2924/05442; H01L 2924/05341; H01L 2224/11849; H01L 2924/06; H01L 2224/05147; H01L 2224/05111; H01L 2224/05166; H01L 2924/04941; H01L 2224/03622; H01L 2924/07025; H01L 2224/05558; H01L 2224/05551

See application file for complete search history.

(56) References Cited

U.S. PATENT DOCUMENTS

| | | | |
|---|---|---|---|
| 10,008,461 B2 * | 6/2018 | Shih | ................. H01L 24/05 |
| 10,354,966 B2 * | 7/2019 | Shih | ................. H01L 24/11 |
| 2002/0034871 A1 | 3/2002 | Chittipeddi et al. | |
| 2003/0080421 A1 | 5/2003 | Sawai et al. | |
| 2003/0167632 A1 | 9/2003 | Thomas et al. | |
| 2007/0020906 A1 | 1/2007 | Chiu et al. | |
| 2007/0069394 A1 | 3/2007 | Bachman et al. | |
| 2007/0075423 A1 | 4/2007 | Ke et al. | |
| 2009/0079070 A1 | 3/2009 | Lin et al. | |
| 2009/0283903 A1 | 11/2009 | Park | |
| 2010/0013094 A1 | 1/2010 | Jo et al. | |
| 2011/0195544 A1 | 8/2011 | Bachman et al. | |
| 2011/0266670 A1 | 11/2011 | England et al. | |
| 2015/0011082 A1 | 1/2015 | Shen et al. | |
| 2015/0097287 A1 | 4/2015 | Chen et al. | |
| 2016/0358868 A1 | 12/2016 | Shih et al. | |

FOREIGN PATENT DOCUMENTS

| | | |
|---|---|---|
| CN | 103474402 A | 12/2013 |
| TW | I223359 B | 11/2004 |
| TW | 201320269 A | 5/2013 |

OTHER PUBLICATIONS

Taiwanese Office Action and Search Report from Taiwanese Application No. 104130982, dated May 23, 2017, 12 pages with English translation.
Decision of Rejection from Taiwanese Application No. 104130982, dated Dec. 13, 2017, 5 pages with English translation.
Chinese Office Action from Chinese Application No. 201510607154.1, dated Apr. 3, 2018, 17 pages with English translation.
Chinese Office Action and Search Report from Chinese Application No. 201510607154.1, dated Nov. 27, 2018, 26 pages.
Chinese Decision of Rejection from Chinese Application No. 201510607154.1, dated Mar. 29, 2019, 25 pages.

\* cited by examiner

METHODS OF FORMING MICROELECTRONIC DEVICES HAVING A PATTERNED SURFACE STRUCTURE

CROSS-REFERENCE TO RELATED APPLICATIONS

This application is a continuation of U.S. patent application Ser. No. 15/966,447, filed Apr. 30, 2018, now U.S. Pat. No. 10,354,966, issued Jul. 16, 2019, which is a divisional of U.S. patent application Ser. No. 14/731,426, filed Jun. 5, 2015, now U.S. Pat. No. 10,008,461, issued Jun. 26, 2018, the disclosure of each of which is hereby incorporated herein in its entirety by this reference.

BACKGROUND

A bump is an important component in a flip-chip package structure for connecting a substrate and chip. The flip-chip package structure often applies the bump as an agent to mechanically or electrically connect the substrate and the chip. The bump is crucial for the connection between the substrate and the chip, as the reliability of the bump affects the operation of the whole flip-chip package structure. The purpose of packaging is to protect the chip during various processes and attach a packaged chip onto a printed circuit board. However, any damage during packaging to the chip is not acceptable.

Reflow process is the most common method of attaching surface mount components to a circuit board and/or a metal pad. For better reliability and attachment to the metal pad, the bump is processed through the reflow process. In the reflow process, the entire assembly of the circuit board and bump is under a thermal treatment, such as by annealing. The thermal treatment may be accomplished by passing the assembly through a reflow oven or under an infrared lamp. Accordingly, it is essential to improve the reliability of the bump in the packaging process.

BRIEF SUMMARY

The present disclosure provides a connector structure. The connector structure includes a semiconductor substrate, a metal layer, a passivation layer, and a conductive structure. The metal layer is over the semiconductor substrate. The passivation layer is over the metal layer and includes an opening. The conductive structure is contacted with the metal layer in a patterned surface structure of the conductive structure through the opening of the passivation layer.

In various embodiments of the present disclosure, the conductive structure includes a bump or a soldering ball.

In various embodiments of the present disclosure, the patterned surface structure of the conductive structure includes a metal portion and a supporting portion.

In various embodiments of the present disclosure, the connector structure further includes an under-bump metallurgy (UBM) layer. The UBM layer is disposed between the metal layer and the conductive structure.

In various embodiments of the present disclosure, the supporting portion of the patterned surface structure is a mesh, regularly aligned pillars, or a concentric cylinder.

In various embodiments of the present disclosure, the pillars have a cross section comprising a polygon, a circle or an oval.

In various embodiments of the present disclosure, the supporting portion of the patterned surface structure is made of at least one inorganic material such as silicon dioxide, silicon nitride, titanium dioxide, aluminum oxide, or at least one organic material such as polyimide, polybenzoxazole (PBO), or a combination thereof.

In various embodiments of the present disclosure, the metal portion of the patterned surface structure is made of Sn, Ag, Cu, Au, alloy or a combination thereof.

In various embodiments of the present disclosure, the UBM layer is made of TiN, Ti, WN, Sn, Ag, Cu, Au, Ni, alloy or a combination thereof.

In various embodiments of the present disclosure, the opening of the passivation layer has a shape comprising a polygon, a circle or an oval.

The present disclosure provides a method of manufacturing a connector structure, and the method includes the following steps. A metal layer is formed over a semiconductor substrate. A passivation layer is formed over the metal layer. The passivation layer is recessed to form an opening. The conductive structure is formed. The conductive structure has a patterned surface structure, and the patterned surface structure is in contact with the metal layer through the opening of the passivation layer.

In various embodiments of the present disclosure, the process of recessing the passivation layer to form the opening includes the following steps. A photoresist is applied onto the passivation layer. The passivation layer is subjected to lithography and etching to form the opening with a remaining portion of the passivation layer as a supporting portion therein.

In various embodiments of the present disclosure, the process of forming the conductive structure includes the following steps. Metal is applied into the opening of the passivation layer. The metal is reflowed to form the conductive structure.

In various embodiments of the present disclosure, after recessing the passivation layer and before forming the conductive structure, the method further includes forming a supporting portion in the opening of the passivation layer.

In various embodiments of the present disclosure, the process of forming the conductive structure includes the following steps. Metal is applied into the opening of the passivation layer. The metal is reflowed to form the conductive structure.

In various embodiments of the present disclosure, the process of forming the conductive structure includes the following steps. The conductive structure is formed, and the conductive structure has the patterned surface structure with a metal portion and a supporting portion. The patterned surface structure of the conductive structure is connected to the metal layer through the opening of the passivation layer.

In various embodiments of the present disclosure, after recessing the passivation layer and before forming the conductive structure, the method further includes forming an under-bump metallurgy (UBM) layer between the metal layer and the conductive structure.

In various embodiments of the present disclosure, the supporting portion is made of at least one inorganic material such as silicon dioxide, silicon nitride, titanium dioxide, aluminum oxide, or at least one organic material such as polyimide, polybenzoxazole (PBO), or a combination thereof.

In various embodiments of the present disclosure, the metal portion of the patterned surface structure is made of Sn, Ag, Cu, Au, alloy or a combination thereof.

In various embodiments of the present disclosure, the UBM layer is made of TiN, Ti, WN, Sn, Ag, Cu, Au, Ni, alloy or a combination thereof.

These and other features, aspects, and advantages of the present disclosure will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The disclosure may be more fully understood by reading the following detailed description of the embodiments, with reference made to the accompanying drawings as follows.

DETAILED DESCRIPTION

Figure 1:
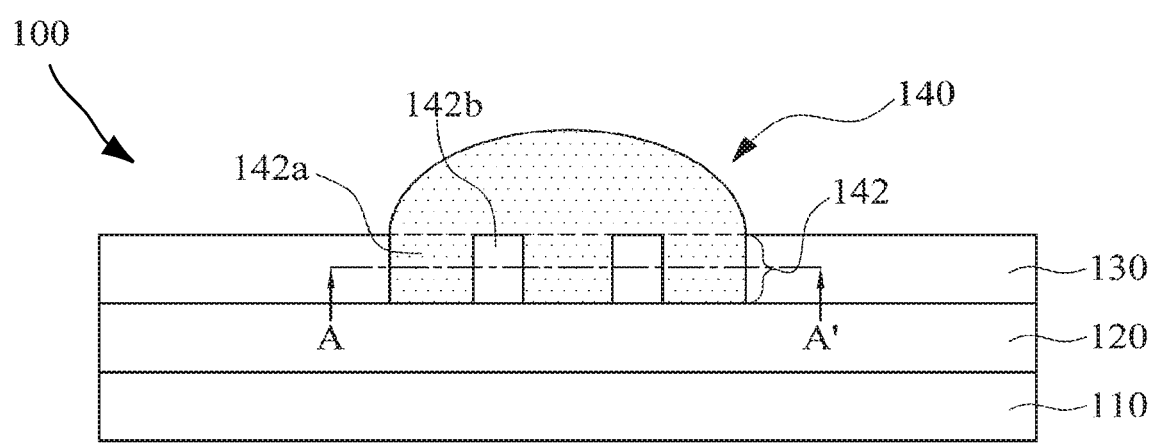
FIG. 1 is a cross-sectional view of a connector structure according to various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

As mentioned above, the bump is crucial for the connection between the substrate and chip, as the reliability of the bump affects the operation of the whole flip-chip package structure. For better reliability and attachment to the metal pad, the bump is processed through the reflow process. However, the bump often causes chip warpage during reflowing. Accordingly, an improved connector structure and a manufacturing method thereof are required.

The present disclosure provides a connector structure and a method of fabrication thereof. The connector structure has a patterned surface structure, which can improve chip warpage during reflowing. Therefore, the connector structure provided by the present disclosure can avoid chip crack, enhance reliability, and further lower the overall warpage level.

FIG. 1 is a cross-sectional view of a connector structure according to various embodiments of the present disclosure. As shown in FIG. 1, a connector structure 100 includes a semiconductor substrate 110, a metal layer 120, a passivation layer 130, and a conductive structure 140. The semiconductor substrate 110 has a top metal layer 120 thereon. The passivation layer 130 with an opening is over the metal layer 120, and the conductive structure 140 is in contact with the metal layer 120 in a patterned surface structure 142 of the conductive structure 140 through the opening of the passivation layer 130. The patterned surface structure 142 of the conductive structure 140 includes a metal portion 142a and a supporting portion 142b. In some embodiments, it should be noted that the supporting portion 142b of the patterned surface structure 142 may be obtained from a remaining portion of the passivation layer 130, from newly added materials in the opening of the passivation layer 130, or by directly forming the supporting portion 142b in the conductive structure 140. The abovementioned options for obtaining the supporting portions will be discussed in greater detail hereafter (in FIGS. 4A-6D).

In some embodiments, the conductive structure 140 includes a bump or a soldering ball. According to some embodiments, the opening of the passivation layer 130 has a shape comprising a polygon, a circle or an oval. When the shape of the opening is a polygon, examples of the polygon include, but are not limited to, triangle, rectangle, trapezoid, parallelogram, rhombus, pentagon, or hexagon. In some embodiments, the material of the supporting portion 142b of the conductive structure 140 includes, but is not limited to, at least one inorganic material such as silicon dioxide, silicon nitride, titanium dioxide, aluminum oxide, or at least one organic material such as polyimide, polybenzoxazole (PBO), or a combination thereof. In some embodiments, the material of the metal portion 142a of the patterned surface structure 142 is Sn, Ag, Cu, Au, alloy or a combination thereof. In some embodiments, the material of the passivation layer 130 is at least one inorganic material such as silicon dioxide, silicon nitride, titanium dioxide, aluminum oxide, or at least one organic material such as polyimide, polybenzoxazole (PBO), or a combination thereof.

The present disclosure provides a connector structure 100, which has the conductive structure 140 in contact with the metal layer 120 through the patterned surface structure 142. Further, the supporting portion 142b of the patterned surface structure 142 can reduce stress during a reflow process to improve chip warpage. Therefore, the patterned surface structure 142 of conductive structure 140 in the connector structure 100 can avoid chip crack, enhance reliability, and further lower the overall warpage level.

Figure 2A:
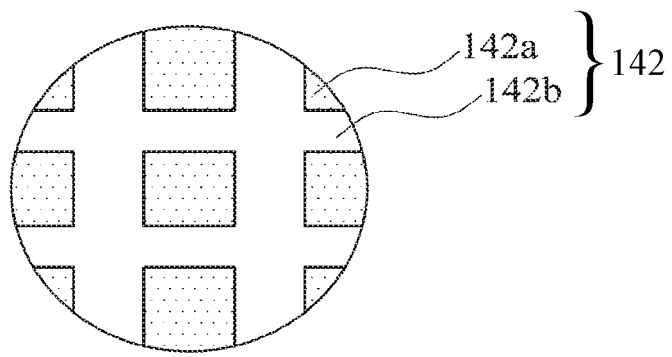
FIGS. 2A-2C are bottom views along line A-A' in FIG. 1 according to various embodiments of the present disclosure.
Figure 2B:
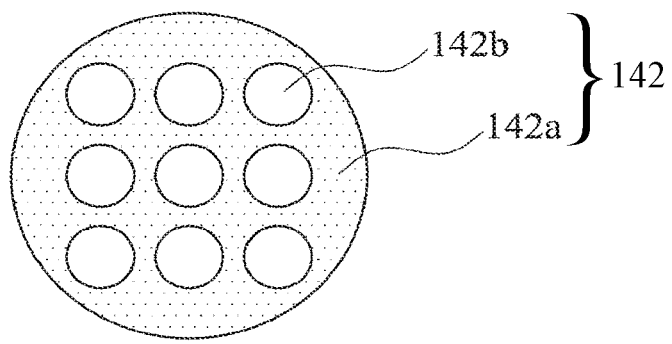
Figure 2C:
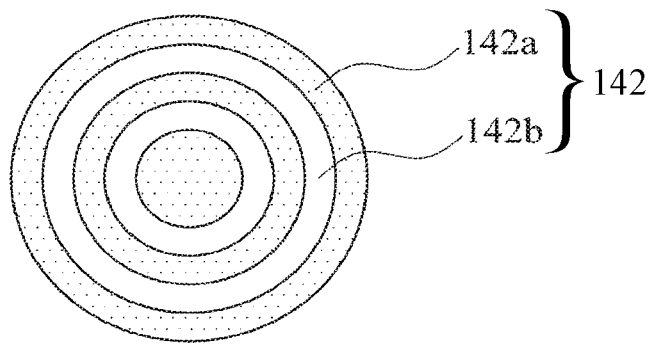

FIGS. 2A-2C are the bottom views along line A-A' in FIG. 1 according to various embodiments of the present disclosure. Referring to FIG. 2A, the supporting portion 142b of the patterned surface structure 142 is a mesh in an embodiment. According to another embodiment, FIG. 2B illustrates the supporting portion 142b of the patterned surface structure 142 as regularly aligned pillars. For example, the pillars have a cross section including a polygon, a circle or an oval. In addition, examples of the polygon include, but are not limited to, triangle, rectangle, trapezoid, parallelogram, rhombus, pentagon, or hexagon. FIG. 2B illustrates the pillars with a circular cross section. In some embodiments, the supporting portion 142b of the patterned surface structure 142 is one or more concentric cylinder. FIG. 2C illustrates that the supporting portion 142b of the patterned surface structure 142 is two concentric cylinders.

Figure 3:
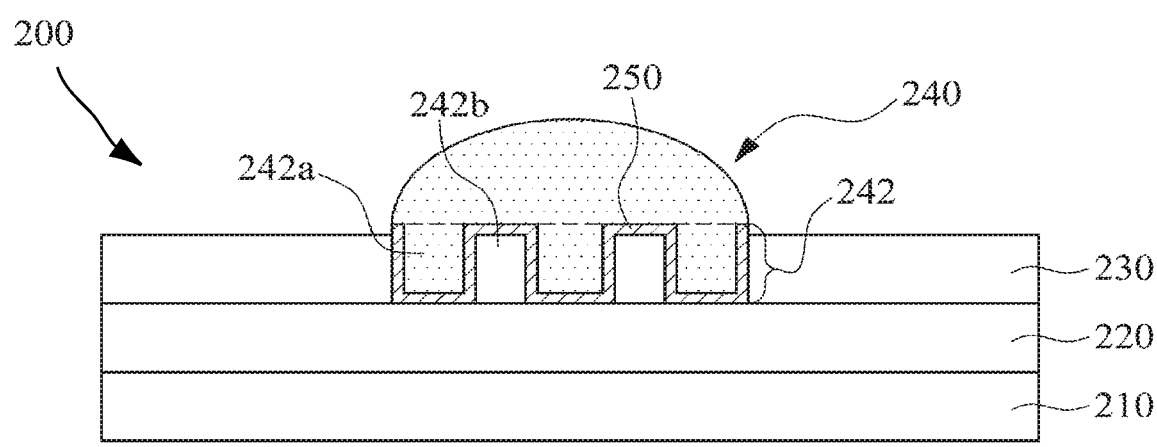
FIG. 3 is a cross-sectional view of a connector structure according to various embodiments of the present disclosure.

FIG. 3 is a cross-sectional view of a connector structure according to various embodiments of the present disclosure. As shown in FIG. 3, a connector structure 200 includes a semiconductor substrate 210, a metal layer 220, a passivation layer 230, a conductive structure 240 and an under-bump metallurgy (UBM) layer 250. The semiconductor substrate 210 has a top metal layer 220 thereon. The passivation layer 230 with an opening is over the metal layer 220, and the conductive structure 240 is contacted with the metal layer 220 in a patterned surface structure 242 of the conductive structure 240 through the opening of the passivation layer 230. The patterned surface structure 242 of the conductive structure 240 includes a metal portion 242a and a supporting portion 242b. The UBM layer 250 is disposed between the metal layer 220 and the conductive structure 240, and examples of the material of the UBM layer 250 include, but are not limited to, TiN, Ti, WN, Sn, Ag, Cu, Au, Ni, alloy or a combination thereof. However, FIG. 3 illustrates the embodiments corresponding to the embodiments shown in FIG. 1, and hence the details are not repeated herein. Therefore, similar materials and any details, such as those discussed above with reference to FIG. 1 may be utilized according to some embodiments.

Figure 4A:
FIGS. 4A-4C are cross-sectional views of intermediate stages during the fabricating of a connector structure according to various embodiments of the present disclosure.
Figure 4B:
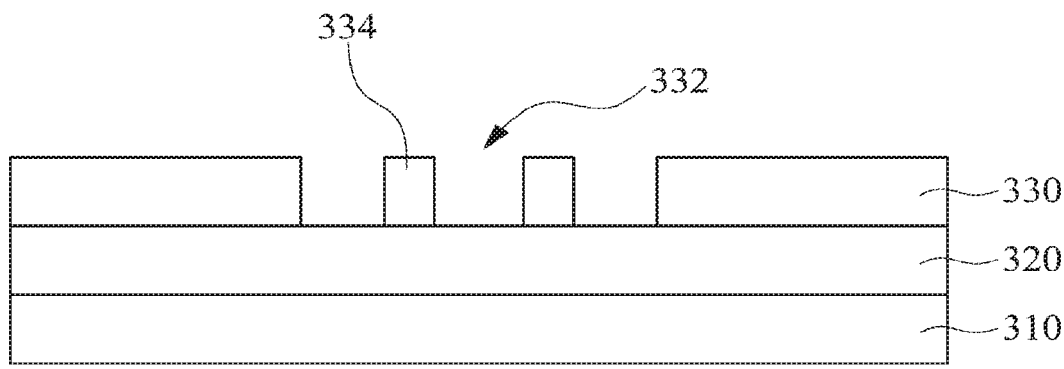
Figure 4C:
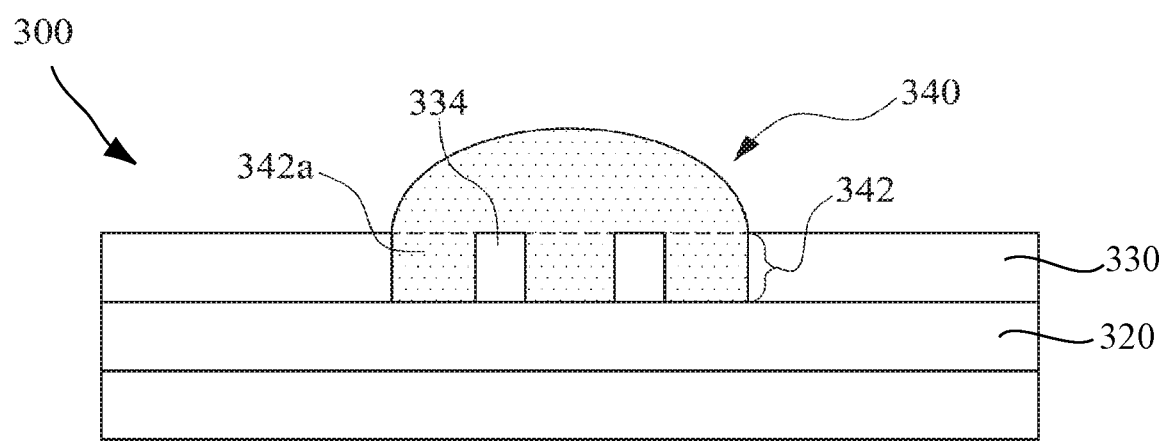

FIGS. 4A-4C are cross-sectional views of intermediate stages during the fabricating of a connector structure according to various embodiments of the present disclosure.

In some embodiments, the present disclosure provides a method of manufacturing a connector structure, such as connector structure 300 (see FIG. 4C). Referring first to FIG. 4A, a metal layer 320 is formed over a semiconductor substrate 310, and then a passivation layer 330 is formed over the metal layer 320. Next, as illustrated in FIG. 4B, the passivation layer 330 is recessed to form an opening 332. As discussed below in greater detail, a photoresist (not shown) is applied onto the passivation layer 330. The passivation layer 330 is subjected to lithography and etching to form the opening 332 with a remaining portion of passivation layer 330 as a supporting portion 334 therein. Continuing in FIG. 4C, metal is applied into the opening 332 (see FIG. 4B), and then the metal is reflowed to form a conductive structure 340 with a patterned surface structure 342. The patterned surface structure 342 includes a metal portion 342a and a supporting portion 334, and is in contact with the metal layer 320 through the opening 332 (see FIG. 4B) of the passivation layer 330. As discussed below in greater detail, examples of the means of applying metal into the opening 332 (FIG. 4B) include, but are not limited to, plating, thermal evaporation or sputtering. In some embodiments, the metal is reflowed by annealing through a reflow oven or under an infrared lamp.

With continued reference to FIGS. 4A-4C, in some embodiments, the material of the supporting portion 334, which is the same as the passivation layer 330, is at least one inorganic material such as silicon dioxide, silicon nitride, titanium dioxide, aluminum oxide, or at least one organic material such as polyimide, polybenzoxazole (PBO), or a combination thereof. The metal portion 342a of the patterned surface structure 342 includes, but is not limited to, Sn, Ag, Cu, Au, alloy or a combination thereof according to some embodiments.

FIGS. 5A-5D are cross-sectional views of intermediate stages during the fabricating of a connector structure according to various embodiments of the present disclosure.

Figure 5A:
FIGS. 5A-5D are cross-sectional views of intermediate stages during the fabricating of a connector structure according to various embodiments of the present disclosure.
Figure 5B:
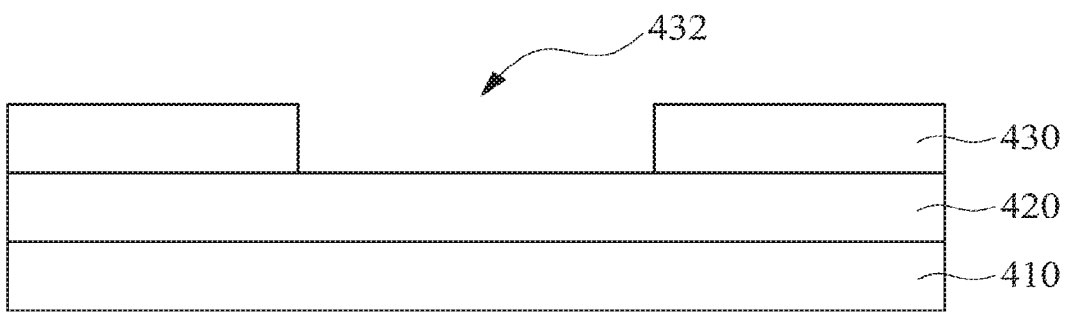
Figure 5C:
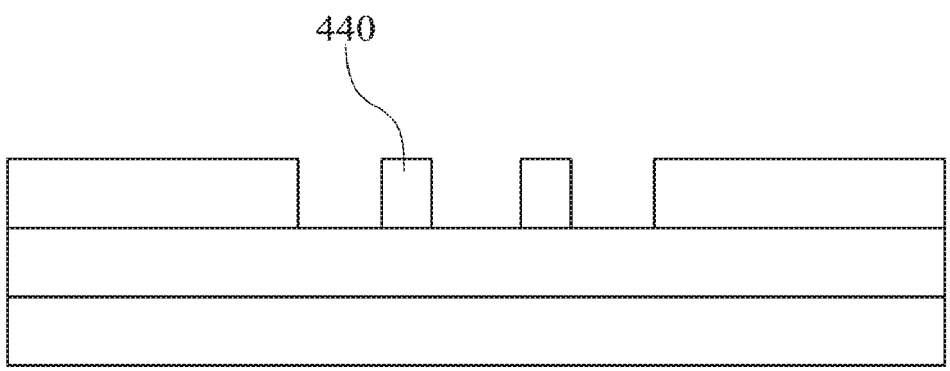
Figure 5D:
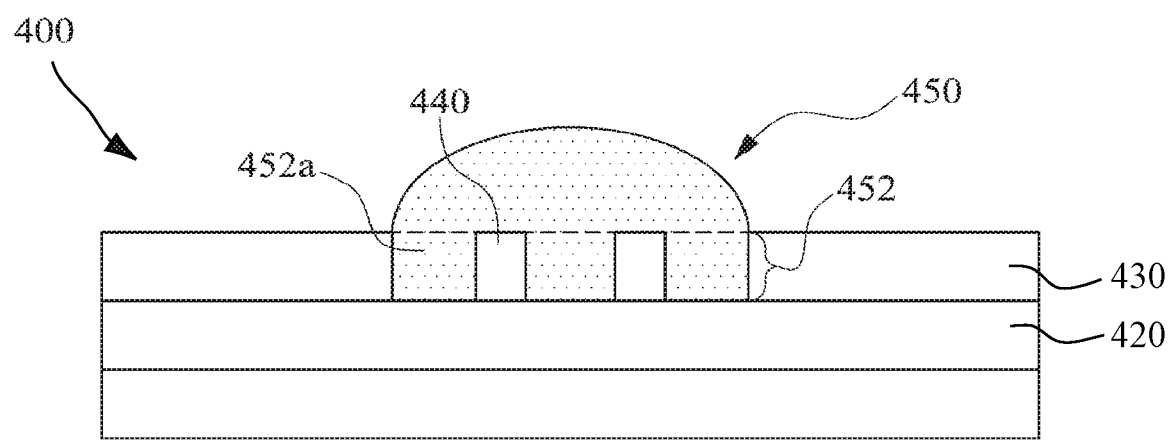

In some embodiments, the present disclosure provides a method of manufacturing a connector structure, such as connector structure 400 (see FIG. 5D). Referring first to FIG. 5A, a metal layer 420 is formed over a semiconductor substrate 410, and then a passivation layer 430 is formed over the metal layer 420. Next, as illustrated in FIG. 5B, the passivation layer 430 is recessed to form an opening 432. As discussed below in greater detail, a photoresist (not shown) is applied onto the passivation layer 430. The passivation layer 430 is subjected to lithography and etching to form the opening 432. Referring now to FIG. 5C, a supporting portion 440 is formed in the opening 432 (see FIG. 5B). According to some embodiments, the supporting portion 440 is made of dielectric material, such as silicon dioxide, silicon nitride, titanium dioxide, or a combination thereof. Continuing in FIG. 5D, metal is applied into the opening 432 (FIG. 5B), and then the metal is reflowed to form the conductive structure 450 with a patterned surface structure 452. The patterned surface structure 452 includes a metal portion 452a and a supporting portion 440, and is in contact with the metal layer 420 through the opening 432 (FIG. 5B) of the passivation layer 430. As discussed below in greater detail, examples of the means of applying metal into the opening 432 (FIG. 5B) include, but are not limited to, plating, thermal evaporation or sputtering. In some embodiments, the metal is reflowed by annealing through a reflow oven or under an infrared lamp. In addition, similar materials such as those discussed above with reference to FIGS. 4A-4C may be utilized according to some embodiments.

FIGS. 6A-6D are cross-sectional views of intermediate stages during the fabricating of a connector structure according to various embodiments of the present disclosure.

Figure 6A:
FIGS. 6A-6D are cross-sectional views of intermediate stages during the fabricating of a connector structure according to various embodiments of the present disclosure.
Figure 6B:
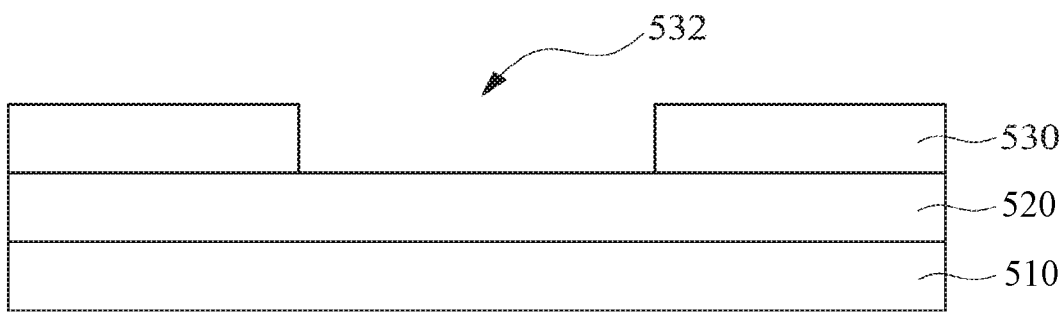
Figure 6C:
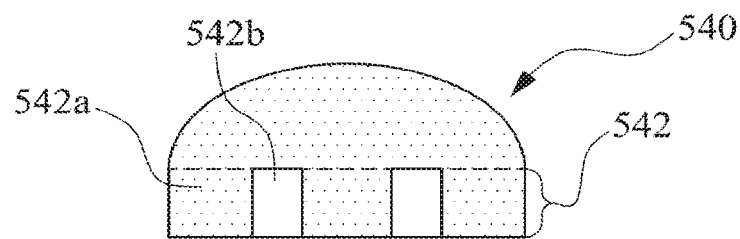
Figure 6D:
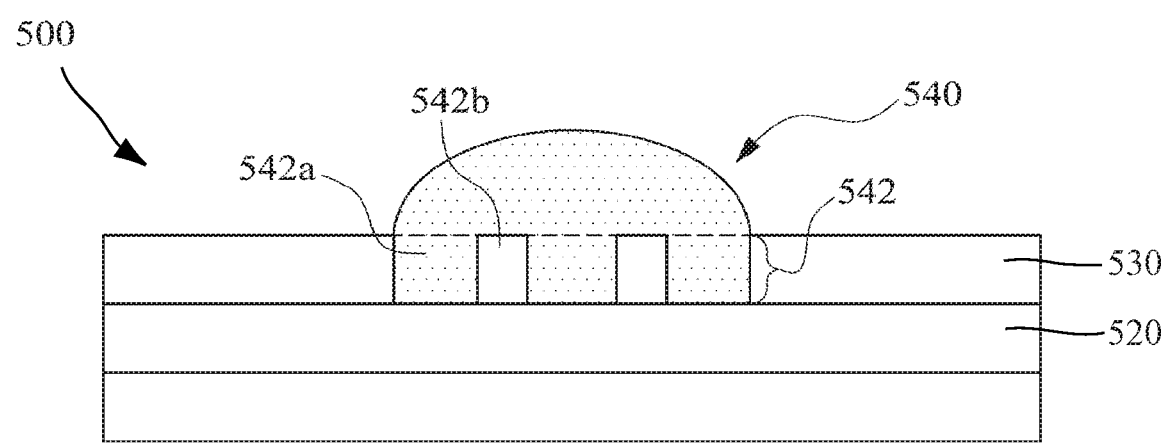

In some embodiments, the present disclosure provides a method of manufacturing a connector structure, such as connector structure 500 (see FIG. 6D). Referring first to FIG. 6A, a metal layer 520 is formed over a semiconductor substrate 510, and then a passivation layer 530 is formed over the metal layer 520. Next, as illustrated in FIG. 6B, the passivation layer 530 is recessed to form an opening 532. As discussed below in greater detail, a photoresist (not shown) is applied onto the passivation layer 530. The passivation layer 530 is subjected to lithography and etching to form the opening 532. Referring to FIG. 6C, a conductive structure 540 is formed independently, and has a patterned surface structure 542 with a metal portion 542a and a supporting portion 542b. Continuing in FIG. 6D, the patterned surface structure 542 of the conductive structure 540 is connected to the metal layer 520 through the opening 532 (see FIG. 6B) of the passivation layer 530. In addition, the similar materials such as those discussed above with reference to FIGS. 4A-4C may be utilized according to some embodiments.

According to some embodiments, after recessing the passivation layer and before forming the conductive structure, the method further includes forming an under-bump metallurgy (UBM) layer between the metal layer and the conductive structure. Examples of the method of forming the UBM layer include, but are not limited to, the process as shown in FIGS. 7A-7D.

FIGS. 7A-7D are cross-sectional views of intermediate stages during the fabricating of a connector structure according to various embodiments of the present disclosure.

Figure 7A:
FIGS. 7A-7D are cross-sectional views of intermediate stages during the fabricating of a connector structure according to various embodiments of the present disclosure.
Figure 7B:
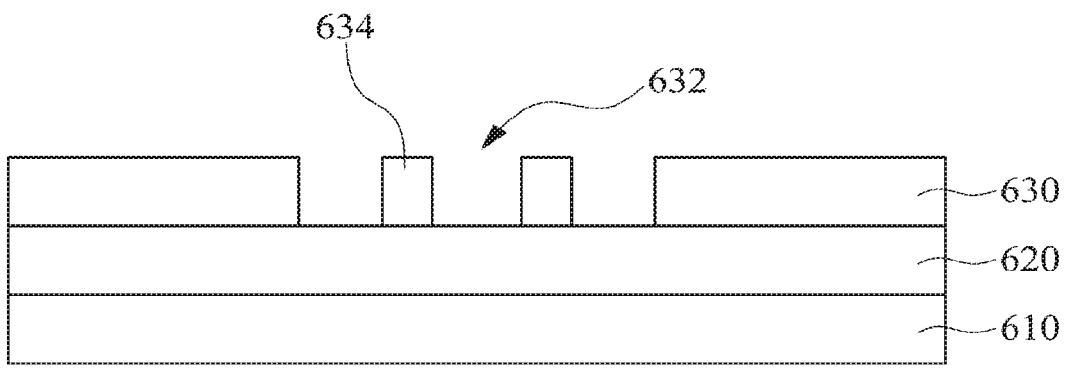
Figure 7C:
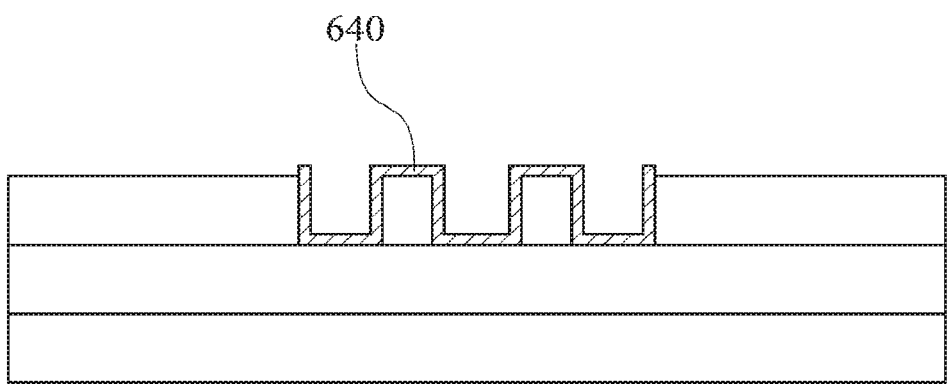
Figure 7D:
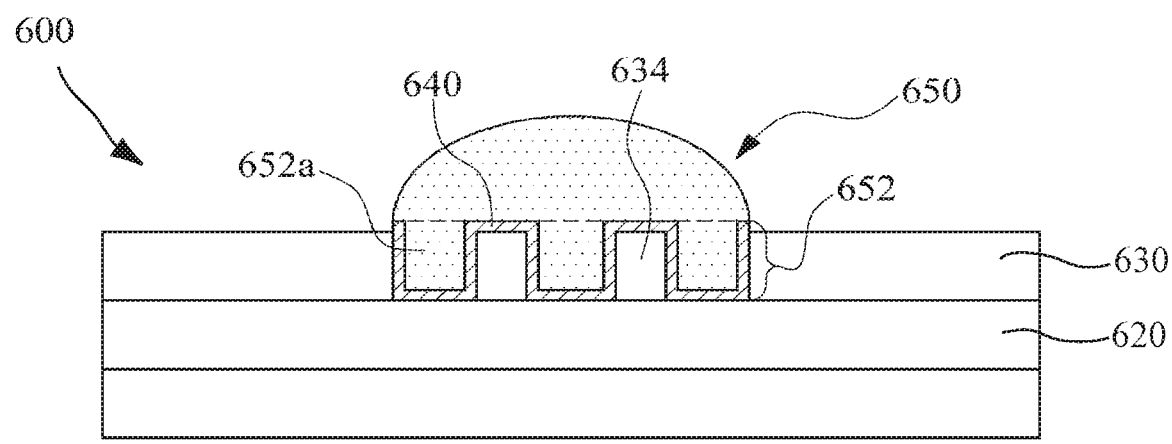

In some embodiments of the present disclosure provide a method of manufacturing a connector structure 600 (see FIG. 7D). Referring first to FIG. 7A, a metal layer 620 is formed over a semiconductor substrate 610, and then a passivation layer 630 is formed over the metal layer 620. Next, as illustrated in FIG. 7B, the passivation layer 630 is recessed to form an opening 632. As discussed below in greater detail, a photoresist (not shown) is applied onto the passivation layer 630. The passivation layer 630 is subjected to lithography and etching to form the opening 632 with a remaining portion of passivation layer 630 as a supporting portion 634 therein. The opening 632 with the supporting portion 634 has an upper surface. Continuing in FIG. 7C, a UBM layer 640 is formed conformally on the upper surface of the opening 632. Subsequently, referring to FIG. 7D, metal is applied into the opening 632 (see FIG. 7B), and then the metal is reflowed to form the conductive structure 650 with a patterned surface structure 652. The patterned surface structure 652 includes a metal portion 652a and a supporting portion 634, and is in contact with the metal layer 620 through the opening 632 (FIG. 7B) of the passivation layer 630. As discussed below in greater detail, examples of the means of applying metal into the opening 632 (FIG. 7B) include, but are not limited to, plating, thermal evaporation or sputtering. In some embodiments, the metal is reflowed by annealing through a reflow oven or under an infrared lamp. In addition, similar materials such as those discussed above with reference to FIGS. 4A-4C may be utilized according to some embodiments.

The embodiments of the present disclosure discussed above have advantages over existing connector structures and processes, and the advantages are summarized below. The bump often causes chip warpage during reflowing. Instead, the present disclosure provides an improved connector structure and a manufacturing method thereof. The conductive structure of the connector structure can contact with the metal layer through the patterned surface structure. Furthermore, the patterned surface structure includes a metal portion and a supporting portion. The supporting portion can reduce stress during reflowing, so as to improve the issue of chip warpage. To summarize the above points, the patterned surface structure of the conductive structure in the connector structure can improve chip warpage during reflowing to avoid chip crack, enhance reliability, and further lower the overall warpage level.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the appended claims.

What is claimed is:

1. A method of forming a microelectronic device, comprising:
    forming a metal material comprising a single material directly on a base material;
    forming a passivation material over the metal material;
    removing at least a portion of the passivation material to form a patterned surface structure in at least one opening in the passivation material; and
    forming a conductive structure comprising a solder material over the patterned surface structure, the conductive structure being in electrical contact with the metal material through the at least one opening in the passivation material, wherein the conductive structure extends between inner sidewalls of the passivation material with an upper surface of the conductive structure vertically above a plane of an upper surface of the passivation material and a maximum lateral extent of the conductive structure above the upper surface of the passivation material being the same or less than a maximum lateral extent of the at least one opening in the passivation material.

2. The method of claim 1, further comprising forming a supporting portion in the at least one opening after removing the at least a portion of the passivation material and before forming the conductive structure.

3. The method of claim 2, wherein forming the supporting portion comprises forming the supporting portion of at least one inorganic material comprising one or more of silicon dioxide, silicon nitride, titanium dioxide, aluminum oxide, or at least one organic material comprising one or more of a polyimide or polybenzoxazole (PBO).

4. The method of claim 1, wherein forming the conductive structure comprises:
    applying metal into the at least one opening in the passivation material; and
    reflowing the metal to form the conductive structure.

5. The method of claim 1, wherein forming the conductive structure comprises connecting the conductive structure and the metal material through the at least one opening in the passivation material.

6. The method of claim 1, wherein forming the conductive structure comprises forming the conductive structure to comprise at least one of Sn, Ag, Cu, Au, an alloy thereof, or a combination thereof.

7. The method of claim 1, wherein forming the conductive structure comprises substantially filling the at least one opening in the passivation material with the solder material of the conductive structure, portions of the conductive structure conforming to substantially entire upper surfaces and sidewalls of the patterned surface structure.

8. The method of claim 1, wherein forming the conductive structure comprises extending the conductive structure at least partially into the at least one opening in the passivation material.

9. The method of claim 1, wherein removing the at least a portion of the passivation material to form the patterned surface structure comprises forming multiple discrete portions of the passivation material within the at least one opening in the passivation material.

10. A method of forming a microelectronic device, comprising:
    forming passivation material over metal material;
    removing at least a portion of the passivation material to form openings therein;
    forming a patterned surface structure within the openings in the passivation material; and
    forming conductive structures comprising a solder material over the patterned surface structure, the conductive structures extending at least partially into the openings in the passivation material, and in electrical contact with the metal material through the openings in the passivation material, the conductive structures conforming to substantially entire portions of upper surfaces and sidewalls of the patterned surface structure, wherein the conductive structures extend laterally within the openings in the passivation material without being formed over exposed upper surfaces of the passivation material.

11. The method of claim 10, wherein removing the at least a portion of the passivation material to form the openings therein comprises removing substantially all of the passivation material within individual openings while retaining another portion of the passivation material between adjacent openings in the passivation material.

12. The method of claim 10, wherein forming the patterned surface structure within the openings in the passivation material comprises disposing dielectric material directly on the metal material after removing the at least a portion of the passivation material to form the openings therein.

13. The method of claim 10, wherein forming the patterned surface structure comprises forming the patterned surface structure to comprise regularly aligned pillars having a circular cross-sectional shape.

14. The method of claim 10, wherein forming the patterned surface structure comprises forming the patterned surface structure to comprise at least two concentric circular structures.

15. The method of claim 10, wherein forming the patterned surface structure comprises forming the patterned surface structure to comprise intersecting regions of first linear portions parallel to a first horizontal direction and second linear portions parallel to a second horizontal direction, transverse to the first horizontal direction, the first linear portions and the second linear portions forming a continuous structure of the passivation material having discrete openings therebetween.

16. The method of claim 10, further comprising forming supporting portions of the patterned surface structure in the conductive structures before forming the conductive structures in the openings in the passivation material.

17. The method of claim 10, wherein forming the conductive structures comprises forming an upper portion of the solder material over upper surfaces of the patterned surface structure and forming a lower portion of the solder material extending laterally between adjacent sidewalls of the patterned surface structure, the upper portion and the lower portion of the solder material being a continuous body of the solder material.

18. The method of claim 10, wherein forming the conductive structures comprises applying the solder material using at least one of plating, thermal evaporation, and sputtering.

\* \* \* \* \*